US00RE44908E

(19) United States
(12) Reissued Patent
Wieland et al.

(10) Patent Number: US RE44,908 E
(45) Date of Reissued Patent: May 27, 2014

(54) ELECTRON BEAM EXPOSURE SYSTEM

(75) Inventors: Marco Jan-Jaco Wieland, Delft (NL); Bert Jan Kampherbeek, Delft (NL); Alexander Hendrik Vincent Van Veen, Rotterdam (NL); Pieter Kruit, Delft (NL)

(73) Assignee: Mapper Lithography IP B.V., Delft (NL)

(21) Appl. No.: 13/343,036

(22) Filed: Jan. 4, 2012

Related U.S. Patent Documents

Reissue of:

(64) Patent No.: 7,091,504
Issued: Aug. 15, 2006
Appl. No.: 11/128,512
Filed: May 12, 2005

U.S. Applications:

(62) Division of application No. 12/189,817, filed on Aug. 12, 2008, now Pat. No. Re. 44,240, which is a division of application No. 10/699,246, filed on Oct. 30, 2003, now Pat. No. 6,897,458.

(60) Provisional application No. 60/422,758, filed on Oct. 30, 2002.

(51) Int. Cl.
*H01J 37/30* (2006.01)
*H01J 37/304* (2006.01)
*H01J 37/06* (2006.01)

(52) U.S. Cl.
USPC ..... 250/494.1; 250/492.3; 250/493.1; 250/492.22; 250/306; 250/307; 260/310; 260/398; 260/396 R

(58) Field of Classification Search
USPC ..... 250/492.22, 494.1, 492.3, 396 R, 306, 250/307, 310, 397, 398
See application file for complete search history.

(56) References Cited

U.S. PATENT DOCUMENTS 5,969,362 A * 10/1999 Kawata et al. ..... 250/398
6,014,200 A * 1/2000 Sogard et al. ..... 355/53

(Continued)

FOREIGN PATENT DOCUMENTS

EP 1300870 4/2003
GB 2340991 3/2000

(Continued)

OTHER PUBLICATIONS

"Microstructures for Particle Beam Control", G.W., Journal of Vacuum Science and Tech., Nov. 1, 1999, pp. 2023-2027, XP000001001.

*Primary Examiner* — Nikita Wells
(74) *Attorney, Agent, or Firm* — Hoyng Monegier LLP; David P. Owen; Coraline J. Haitjema

(57) ABSTRACT

The invention relates to an electron beam exposure apparatus for transferring a pattern onto the surface of a target, comprising:

a beamlet generator for generating a plurality of electron beamlets;

a modulation array for receiving said plurality of electron beamlets, comprising a plurality of modulators for modulating the intensity of an electron beamlet;

a controller, connected to the modulation array for individually controlling the modulators, an adjustor, operationally connected to each modulator, for individually adjusting the control signal of each modulator;

a focusing electron optical system comprising an array of electrostatic lenses wherein each lens focuses a corresponding individual beamlet, which is transmitted by said modulation array, to a cross section smaller than 300 nm, and a target holder for holding a target with its exposure surface onto which the pattern is to be transferred in the first focal plane of the focusing electron optical system.

20 Claims, 8 Drawing Sheets

(56) References Cited

U.S. PATENT DOCUMENTS

| | | | | |
|---|---|---|---|---|
| 6,633,366 | B2 * | 10/2003 | de Jager et al. | 355/67 |
| 6,797,953 | B2 * | 9/2004 | Gerlach et al. | 850/16 |
| 6,897,458 | B2 * | 5/2005 | Wieland et al. | 250/494.1 |
| 2003/0132382 | A1 * | 7/2003 | Sogard | 250/311 |
| 2003/0155522 | A1 | 8/2003 | Ooae et al. | |

FOREIGN PATENT DOCUMENTS

| | | |
|---|---|---|
| JP | 2002110527 | 4/2002 |
| WO | WO 02/41372 | 5/2002 |
| WO | WO 02/43102 | 5/2002 |

* cited by examiner

ELECTRON BEAM EXPOSURE SYSTEM

Matter enclosed in heavy brackets [ ] appears in the original patent but forms no part of this reissue specification; matter printed in italics indicates the additions made by reissue.

*Notice: More than one reissue application has been filed for the reissue of U.S. Pat. No. 7,091,504. The reissue applications are application Ser. No. 12/189,817 (filed Aug. 12, 2008) (the parent of this application), and Ser. No. 13/343,036 (filed Jan. 4, 2012) (this application), and Ser. No. 13/343,038 (filed Jan. 4, 2012)(filed currently with this application) which are divisional reissues of U.S. Pat. No. 7,091,504.*

The present patent application is a Divisional of application Ser. No. 10/699,246 filed Oct. 30, 2003, now U.S. Pat. No. 6,897,458 which is a Non-Provisional of Provisional Application No. 60/422,758 filed Oct. 30, 2002.

BACKGROUND

Several kinds of electron beam exposure systems are known in the art. Most of these systems are provided to transfer very precise patterns onto an exposure surface of a substrate. Since lithography features are pushed to become smaller and smaller following Moore's law, the high resolution of electron beams could be used to continue the drive to even smaller features than today.

A conventional electron beam exposure apparatus has a throughput of about 1/100 wafer/hr. However, for lithography purposes a commercially acceptable throughput of at least a few wafers/hr is necessary. Several ideas to increase the throughput of an electron beam exposure apparatus have been proposed.

U.S. Pat. No. A1-5,760,410 and U.S. Pat. No. A1-6,313,476, for instance, disclose a lithography system using an electron beam having a cross section, which is modified during the transferring of a pattern to an exposure surface of a target. The specific cross section or shape of the beam is established during operation by moving the emitted beam inside an aperture by using electrostatic deflection. The selected aperture partially blanks and thereby shapes the electron beam. The target exposure surface moves under the beam to refresh the surface. In this way a pattern is written. The throughput of this system is still limited.

In US A1-20010028042, US-A1-20010028043 and US-A1-20010028044 an electron beam lithography system is disclosed using a plurality of electron beams by using a plurality of continuous wave (CW) emitters to generate a plurality of electron beamlets. Each beamlet is then individually shaped and blanked to create a pattern on the underlying substrate. As all these emitters have slightly different emission characteristics, homogeneity of the beamlets is a problem. This was corrected by levelling every individual beam current to a reference current. Correction values for the mismatch are extremely difficult to calculate and it takes a significant amount of time, which reduces the throughput of the system.

In Journal of Vacuum Science and Technology B18 (6) pages 3061-3066, a system is disclosed which uses one $LaB_6$-source for generating one electron beam, which is subsequently, expands, collimated and split into a plurality of beamlets. The target exposure surface is mechanically moved relatively to the plurality of beamlets in a first direction, the beamlets are switched on and off using blanking electrostatic deflectors and at the same time scanning deflectors sweep the beamlets which have passed the blanker array over the target exposure surface in a direction perpendicular to the first direction, thus each time creating an image. In this known system, electrostatic and/or magnetic lenses are used to reduce the image before it is projected on the target exposure surface. In the demagnification process at least one complete intermediate image is created, smaller than the one before. When the entire image has the desired dimensions, it is projected on the target exposure surface. A major disadvantage of this approach is that the plurality of electron beamlets together has to pass through at least one complete crossover. In this crossover, Coulomb interactions between electron in different beamlets will disturb the image, thus reducing the resolution. Moreover, due to the strong demagnification of the image, the area that is exposed at one time is rather small, so a lot of wafer scans are needed to expose a die: 16 scans are needed to expose one die, requiring a very high stage speed for reaching a commercially acceptable throughput.

In GB-A1-2.340.991, a multibeam particle lithography system is disclosed having an illumination system, which produces a plurality of ion sub-beams. The illumination systems use either a single ion source with aperture plates for splitting a beam in sub-beams, or a plurality of sources. In the system using a single ion source, the aperture plate is projected (demagnified) on a substrate using a multibeam optical system. The system furthermore uses a deflection unit of electrostatic multipole systems, positioned after the multibeam optical system, for correcting individual imaging aberrations of a sub-beam and positioning the sub-beam during writing. The publication does not disclose how each sub-beam is modulated. Furthermore, controlling individual sub-beams is a problem, and maintaining inter-sub-beam uniformity.

In Jpn. J. Appl. Phys. Vol. 34 (1995) 6689-6695, a multi-electron beam ('probes') lithography system is disclosed having a specific ZrO/W-TFE thermal emission source with an emitter tip immersed in a magnetic field. A disadvantage of such a source is its limited output. Furthermore, this source needs a crossover. The mutual homogeneity of the 'probes' is not further discussed. Furthermore, the intensity of the source is a problem.

The article furthermore in a general way mentions a writing strategy in which a stage is moved in one direction, and deflectors move the 'probes' concurrently through the same distance perpendicular to the direction of the stage movement. A further problem, not recognised in this publication, is correction of deviation of electron beamlets from their intended positions.

SUMMARY OF THE INVENTION

It is an objective of the current invention to improve the performance of known electron beam exposure apparatus.

Another objective is to improve the resolution of known electron beam exposure apparatus.

Yet another objective of the current invention is to improve throughput of known electron beam exposure apparatus.

Yet another objective of the current invention is to overcome the problems related to Coulomb interactions and the demagnification methods in the prior art.

Another objective of the current invention is to simplify controlling uniformity of beamlets, especially during writing.

The invention relates to an electron beam exposure apparatus for transferring a pattern onto the surface of a target, comprising:

beamlet generator for generating a plurality of electron beamlets;

a modulation array for receiving said plurality of electron beamlets, comprising a plurality of modulators for modulating the intensity of an electron beamlet;

a controller, operationally connected to the modulation array for individually controlling the modulators using control signals;

an adjustor, operationally connected to each modulator, for individually adjusting the control signal of each modulator;

a focusing electron optical system comprising an array of electrostatic lenses wherein each lens focuses a corresponding individual beamlet, which is transmitted by said modulation array, to a cross section smaller than 300 nm, and a target holder for holding a target with its exposure surface onto which the pattern is to be transferred in the first focal plane of the focusing electron optical system.

In this apparatus, electron crossover could be avoided, as it does not demagnify a complete (part of) an image. In this way, resolution and writing speed increases. Furthermore, it avoids the needs to control the current in each individual beamlet. The apparatus is less complex as the position correction and modulation are integrated.

In an embodiment of an electron beam exposure apparatus according to the present invention, said modulation array comprises:

a beamlet blanker array comprising a plurality of beamlet blankers for the deflection of a passing electron beamlet, a beamlet stop array, having a plurality of apertures aligned with said beamlet blankers of said beamlet blanker array.

In this way, it is possible to avoid crossover of electron beamlets in one single focal point, and make high-speed modulation possible. In an embodiment, substantially every beamlet blanker is aligned with an electron beamlet, in order to make it possible to individually modulate every beamlet. Furthermore, the beamlet stop array comprises at least one plane of apertures, substantially every aperture being aligned with one beamlet, preferably with an aperture centred with respect to a beamlet. In this way, a beamlet passes an aperture when an electron beamlet is not deflected, and a beamlet is blocked or stopped when the beamlet is deflected. In an embodiment of this modulation array, the controller is operationally connected to said beamlet blankers.

In an embodiment, the electron beam exposure apparatus is furthermore provided with measuring means for measuring the actual position of at least one of said beamlets, and the controller is provided with memory means for storing said actual position and a desired position, a comparator for comparing the desired position and the actual position of said beamlets, and wherein the adjustor is operationally connected to the controller for receiving instructions for adjusting the control signals issued to the modulators to compensate for the measured difference between said desired position and said actual position of said electron beamlets. In this way, by adjusting control signals, positioning of the beamlets can be corrected in an easy way. Measurement of the actual positions can for instance be done as described in U.S. Pat. No. A1-5, 929,454.

In an embodiment, the controller is operationally connected to the beamlet blankers, in an embodiment via the adjustor.

In an embodiment, the adjustor is operationally connected to the controller for receiving instructions indicating the amount of the adjustments. The amount of the adjustments can be determined based a resulting value of the above-mentioned comparator.

In a further embodiment, the adjustor is adapted for individually adjusting timing of each control signal. In this very easy way, correction can be accomplished.

In an embodiment of the electron beam exposure apparatus according to the present invention, the beamlet generating means comprise:

a source for emitting at least one electron beam, at least one beamsplitter for splitting said at least one emitted electron beam into said plurality of electron beamlets In this way, a uniform intensity distribution among the beamlets is easily achieved if the source emits uniformly in all relevant directions. In an embodiment, the electron beam exposure apparatus further comprising a second electrostatic lens array located between said beam splitting means and said beamlet blanker array to focus said plurality of electron beamlets. In this embodiment, substantially every electrostatic lens is aligned and focuses one electron beamlet. In a further embodiment thereof, the beamlet blanker array is located in the focal plane of said second electrostatic lens array.

In an embodiment of the electron beam exposure apparatus of the current invention with beamsplitter, the beamsplitter comprise a spatial filter, preferably an aperture array. In this way, one source with one beam, or, when source intensity is insufficient or intensity fluctuates across the beam, several sources, are easily split into a plurality of beamlets.

When source intensities are high, the splitting means can comprise a number of aperture arrays in a serial order along the path of the electron beam or plurality of beamlets, the aperture arrays having mutually aligned apertures, each next aperture array along the path from the source to the target having apertures that are smaller than the apertures of the previous aperture array. This reduces heat load.

In an embodiment of the aperture array, the apertures of each aperture array are arranged in a hexagonal structure, which makes it possible to obtain close integration.

In a further embodiment of the electron beam exposure apparatus comprising splitting means comprising an aperture array, each aperture of the aperture array has an area inversely proportional to the current density based on the beamlet that is transmitted through that same aperture.

In a further embodiment of the electron beam exposure apparatus comprising a beamsplitter, the beamsplitter comprises an aperture array, wherein the aperture sizes in the aperture array are adapted to create a discrete set of predetermined beamlet currents.

These embodiments improve the uniformity of the electron beamlets.

In yet a further embodiment of the electron beam exposure apparatus comprising the beamsplitter, the beamsplitter comprises an electrostatic quadrupole lens array.

In an embodiment, the electron beam exposure apparatus according to the present invention comprises a thermionic source. In an embodiment, the thermionic source is adapted for being operated in the space charge limited regime. It was found that space charge has a homogenising effect, which is favourable in this specific application. Furthermore, in certain settings, the space charge may have a negative lens effect.

In a further embodiment with the thermionic source, the thermionic electron source has a spherical cathode surface. In an embodiment, the thermionic source comprises at least one extractor electrode. In another embodiment, the extractor electrode is a planar extractor electrode. In an embodiment thereof, the extractor is located after the space charge region and provided with a positive voltage for inducing a negative lens effect. These voltages can be set at a predefined value for creating a negative lens effect for the emitted electron beam.

In an alternative embodiment, the extractor electrode has a spherical surface with through holes. All these embodiments serve to create a negative lens influence on the electron beam, thus avoiding a crossover in the electron beam.

In another embodiment of the electron beam exposure apparatus of the current invention, the apparatus further comprises an illumination system that transforms the electron beam, emitted by said source, into a collimated electron beam before it reaches said splitting means.

In yet another embodiment of the electron beam exposure apparatus said beamlet generator comprises an array of sources of which each source is responsible for the generation of an electron beamlet. In a further embodiment thereof, the electron beam exposure apparatus further comprising a second electrostatic lens array located between said array of sources and said beamlet blanker array to focus said plurality of electron beamlets.

In an embodiment of the electron beam exposure apparatus with beamlet blanking means, said beamlet blanker comprise electrostatic deflectors.

In yet another embodiment of the electron beam exposure apparatus according to the invention, it further comprising scanning deflection means provided between the modulation array and the focusing electron optical system for deflecting the electron beamlets to scan said target exposure surface. In an embodiment thereof, the scanning deflection means comprises electrostatic scan deflectors. In a further embodiment thereof, the electron beam exposure apparatus is further provided with actuating means for moving said electrostatic scan deflectors and said means for holding the target relatively to each other in the plane of the surface onto which the pattern is to be transferred in a direction that differs from the direction of the deflection performed by said electrostatic scan deflectors.

In an embodiment, the adjustor or a time shifter are adapted for shifting a timing base of the scanning deflection means and the actuators with respect to each other. In an embodiment thereof, the control signals of the modulators have a timing base and the actuators of the target holder have a second timing base, and there timing bases can be shifted with respect to one another. This can for instance be used to have a critical component, which has to be written on the target surface and which would lay between two beamlets, written using only one beamlet.

In a further embodiment thereof, the electron beam exposure apparatus furthermore comprises an additional aperture plate between the modulation array and the focussing electron optical system, the additional aperture plate having one surface directed to and substantially parallel to the exposure surface of the target, wherein said electrostatic scan deflectors are conducting strips deposited on the side of the additional aperture plate facing the exposure surface of the target located between said blanker array and the electrostatic lens array of the focusing electron optical system. In another embodiment thereof, the electrostatic scan deflectors are conducting strips deposited at the target exposure surface side of any of the lens plates present in the focusing electron optical system. In an embodiment thereof, the conducting strips alternatively have a positive or negative potential.

In an embodiment of the electron beam exposure apparatus with the blanking electrostatic deflectors, these deflectors deflect the electron beamlets in such a way that a predetermined section of the beamlet is stopped by the beamlet stop array.

In a further embodiment of the electron beam exposure apparatus according to the present invention, it further comprises a post-reduction acceleration stage, located between the electrostatic lens array of the focusing electron optical system and said protective means, for accelerating the electrons in the plurality of transmitted electron beamlets.

In an embodiment of the controller, it is furthermore provided with correction means to compensate for the incorrect positioning of the electron beamlets on the target exposure surface by comparing the theoretical position and the actual position of said beamlets adjusting the control signals to compensate for the measured difference between said theoretical position and said actual position of said electron beamlets In an embodiment of the electron beam exposure apparatus according to the present invention, it further comprising protective means to prevent particles released by impinging electrons to reach any one of the aperture arrays, lens arrays or blanker arrays, preferably located between the electrostatic lens array of the focusing electron optical system and the exposure surface of a target, preferably comprising an aperture array wherein the apertures have a size smaller than 20 μm.

In an embodiment of the electron beam exposure apparatus according to the present invention, all lens arrays, aperture arrays and blanker arrays are connected to a power supply, which, when gas is admitted into the system, creates a plasma that cleans the plates and removes all contaminants.

In a further embodiment, the electron beam exposure apparatus according to the present invention, the system is operated at an elevated temperature of about 200-600° C. to keep the apparatus clean.

The invention further relates to an electron beam exposure apparatus for transferring a pattern onto the surface of a target, comprising:

a beamlet generator for generating a plurality of electron beamlets;

a modulation array for receiving said plurality of electron beamlets, comprising a plurality of modulators for modulating the intensity of an electron beamlet;

a controller, operationally connected to the modulation array, for individually controlling the modulators using control signals;

a focusing electron optical system comprising an array of electrostatic lenses wherein each lens focuses a corresponding individual beamlet, which is transmitted by said modulation array, to a cross section smaller than 300 nm, and a target holder for holding a target with its exposure surface onto which the pattern is to be transferred in the first focal plane of the focusing electron optical system, wherein said beamlet generator comprises at least one thermionic source, said source comprising at least one extractor electrode adapted for being operated in a space charge limited region, said source adapted for generating an electron beam, and said beamlet generator furthermore provided with a beamsplitter for splitting said electron beam up into a plurality of electron beamlets.

Using such a specific beamlet generator makes it possible to provide uniform beamlets with a sufficient current to provide a high throughput.

In an embodiment thereof, said extractor electrode is located after said space charge region and is provided with a positive voltage for inducing a negative lens effect to said electron beam.

The invention furthermore pertains to an electron beam generator for generating a plurality of electron beamlets, wherein said beamlet generator comprises at least one thermionic source, said source comprising at least one extractor electrode adapted for being operated in a space charge limited region, said source adapted for generating an electron beam, and said beamlet generator furthermore provided with a beamsplitter for splitting said electron beam up into a plurality of electron beamlets.

The invention furthermore pertains to an electron beam exposure apparatus for transferring a pattern onto the surface of a target, comprising a beamlet generator for generating a plurality of electron beamlets, a plurality of modulators for modulating each electron beamlet, and a controller for providing each modulator with a control signal, said control signal having a timing base, wherein the controller is adapted for individually adjusting the timing base of a control signal with respect to the other control signals.

In this apparatus, the problem of positioning and modulating is solved in a very simple and elegant way, reducing the number of components and providing a robust apparatus.

The invention further pertains to a method for transferring a pattern onto a target exposure surface with an electron beam, using an electron beam exposure apparatus described above, and to a wafer processed using the apparatus of the current invention. The apparatus can furthermore be used for the production of mask, like for instance used in state-of-the-art optical lithography systems.

BRIEF DESCRIPTION OF THE DRAWINGS

The invention will be further elucidated in the following embodiments of an electron beam exposure apparatus according to the current invention, in which.

DESCRIPTION OF EMBODIMENTS

Figure 1:
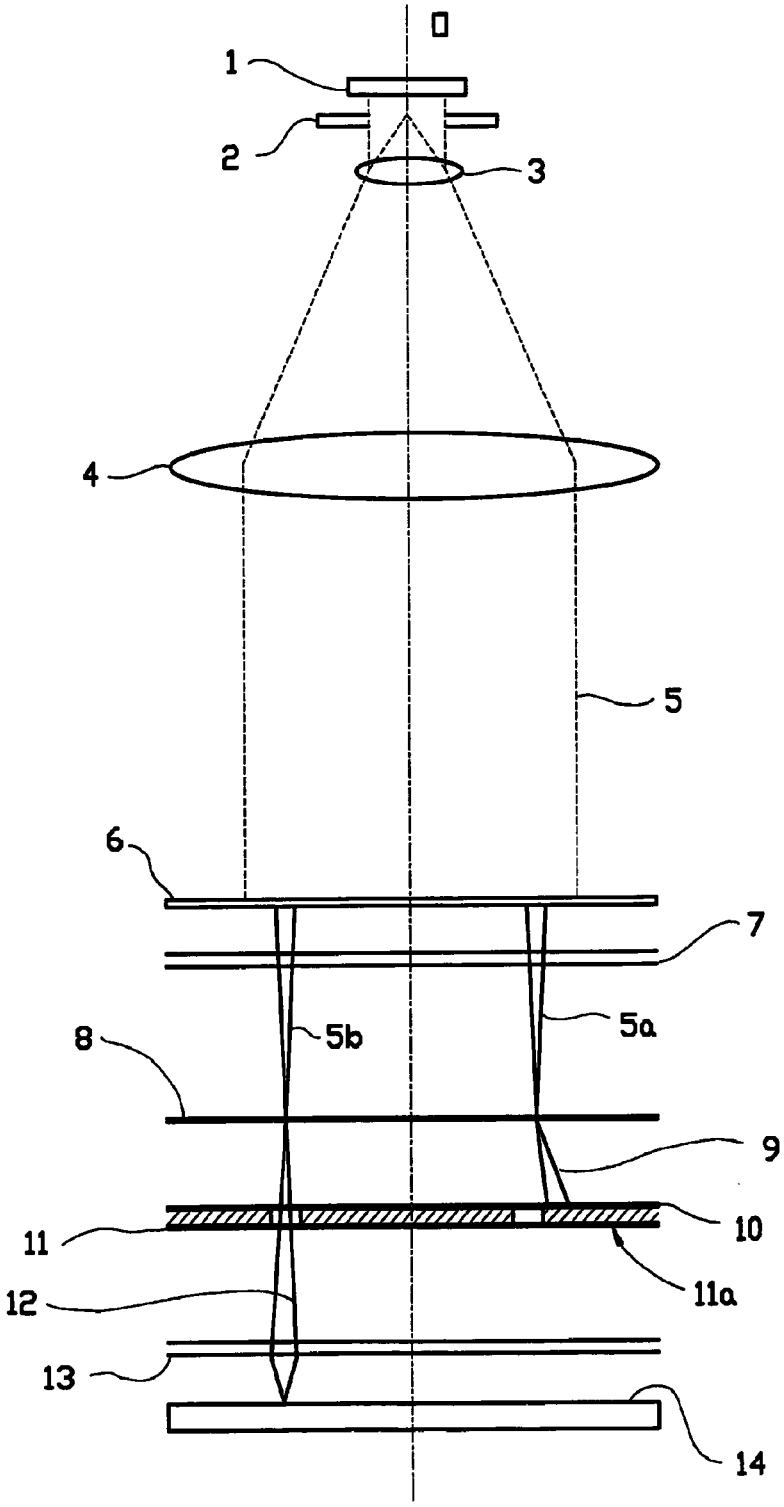
FIG. 1 shows an apparatus according to the present invention.

An embodiment of the present invention is schematically shown in FIG. 1. Electrons are emitted from a single, stable electron source 1. An illumination system focuses and collimates the emitted electron beam 5 to illuminate a desired area on an aperture plate 6 uniformly. This can for instance be established by using lenses 3 and 4. Due to the aperture plate 6 the electron beam 5 is split in a plurality of electron beamlets, two of which 5a and 5b, are shown. An alternative way to create a plurality of electron beamlets is to use an array of electron sources. Each electron source generates an electron beamlet, which is modulated in the same way as the one created with a combination of a single source and splitting means. Since the emission characteristics of each source are slightly different, a single source 1 with beamsplitter 6 is preferred. An array of electrostatic lenses 7 focuses each beamlet to a desired diameter. A beamlet blanker array 8 is positioned in such a way that each individual beamlet coincides with an aperture in the plate of beamlet blanker array 8. The beamlet blanker array 8 comprises beamlet-blankers, for instance blanking electrostatic deflectors. When a voltage is applied on a blanking deflector an electric field across the corresponding aperture is established. The passing electron beamlet, for example beamlet 9, deflects and terminates at the beamlet stop array 10, located behind the beamlet blanker array 8 following the electron beamlet trajectory. When there is no voltage applied to the blanking deflector the electron beamlet will pass the beamlet stop array 10, and reach the focusing electron optical system comprising an array of electrostatic lenses 13. This array 13 focuses each of the transmitted beamlets 12 individually on the target exposure surface 14. Finally scanning deflection means, most often electrostatic scan deflectors, move the beamlets together in one direction over the target exposure surface 14. In the embodiment shown in FIG. 1 the scan deflectors are located on the target exposure surface side 11a of beamlet stop array 10, thus forming an additional scan deflection array 11. However, other locations are also possible. During the scanning the target exposure surface 14 and the scan deflectors moves relatively to one another in a direction different from the direction of the scan deflection. Usually the target is a wafer or a mask covered with a resist layer.

Figure 2B:
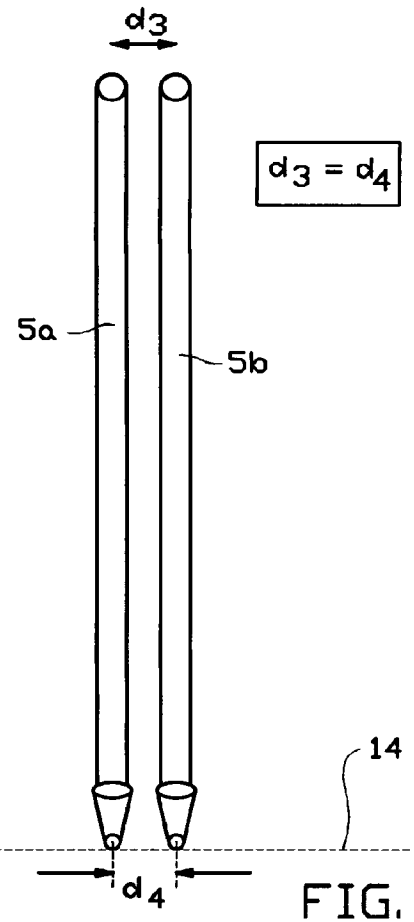
FIG. 2B shows a detail of the electron beam exposure apparatus.
Figure 2A:
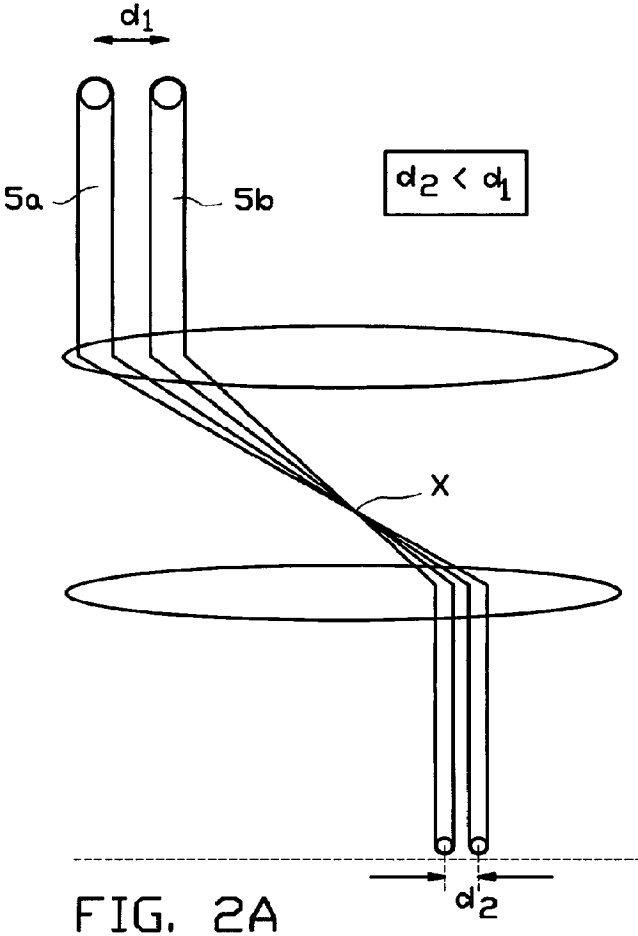
FIG. 2A shows a detail of a known electron beam exposure apparatus.

A remarkable aspect of the configuration shown in FIG. 1 is that the entire image that is created by the combination of beamlet blanker array 8 and beamlet stop array 10 is not demagnified as a whole. Instead, each individual beamlet is individually focused on the target exposure surface 14 by the focusing electron optical system 13. The difference between these two approaches is shown in FIGS. 2A and 2B. In FIG. 2A an entire image comprising 2 electron beamlets 5a and 5b is demagnified to acquire the desired resolution. To demagnify an image requires at least one crossing X. In this crossing, all the electrons have to pass a small area. Coulomb interactions deteriorate the resolution at that crossing X.

In the present invention the method shown in FIG. 2B is used. Consider two adjacent beamlets 5a, 5b that are projected on the target exposure surface 14. Using the demagnification approach the distance between the two beamlets also becomes smaller. The focusing approach of the current invention, however, does not change this distance between two beamlets. Only the cross section of each beamlet is reduced.

The electron source 1 of FIG. 1 typically delivers 100 $A/cm^2$ from an area of about 30-300 micron squared. In an embodiment, a thermionic source is used. The electrons are preferably emitted in the space charge limited emission regime in order to benefit from a homogenizing effect of the space charge. Examples of such a source are a $LaB_6$ crystal, a dispenser source comprising Barium Oxide, or a dispenser source comprising a layer of Barium or Tungsten covered with Scandium Oxide.

The extractor electrodes 2 usually, but not necessarily, focus the beam. The illumination lenses 3-4 create a parallel beam of electrons 5 on the aperture array 6. The lenses 3-4 are optimised to limit the beam energy spread as a result of Coulomb interactions, i.e. the opening angle of the beam is made as large as possible. Furthermore lenses 3-4 are optimised to limit the beam blur created by chromatic and spherical aberration effects. For the latter it may be advantageous to use the aperture array 6 as a lens electrode, because this may create negative chromatic and spherical aberrations, resulting in a compensation of the aberrations of lenses 3-4. Furthermore, it is possible to use lens 4 for magnification of the pattern by slightly focusing or defocusing it.

In such an embodiment, however, the electron beam emitted from the single emitter is focussed in a small crossover x before it is expanded. Within this crossover x there is a large energy spread due to electron-electron interactions in this crossover x. In the end the crossover x will be imaged demagnified on the target exposure surface. Due to the Coulomb interactions the desired resolution is not achieved. A method to expand and collimate the expanded beam without a crossover is therefore desirable.

Figure 3:
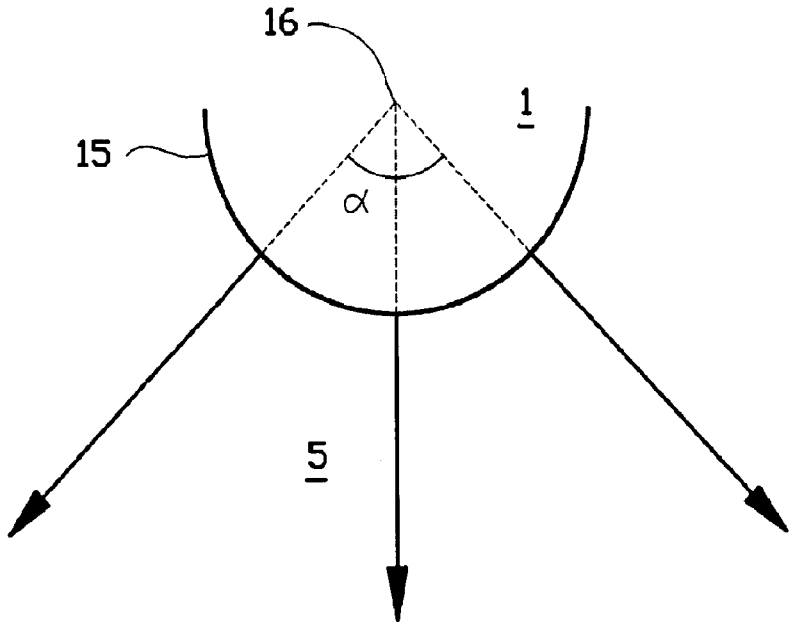
FIG. 3 shows an electron source with a spherical outer surface.

In a first embodiment, shown in FIG. 3, crossover in the illumination electron optics is avoided by using an electron source 1 with a spherical or a hemispherical outer surface 15. In this configuration a large opening angle $\alpha$ is formed, which reduces the blur due to electron-electron interactions in the emitted electron beam 5. Additionally the electron beams are forming a spherical wave front, which results in a virtual crossover 16 located in the centre of the source. There are no electrons present in the virtual crossover; so disturbing electron-electron interactions are absent.

The electrons can be extracted with a spherical extractor that comprises large holes. The main advantage of the spherical shape of the extractor is the more homogeneous field that is created.

Figure 3A:
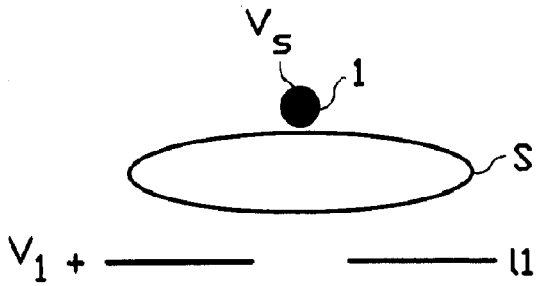
FIG. 3A shows a source with a space charge region.

In an alternative embodiment, shown in FIG. 3A, crossover is avoided by extracting the electrons from the source/cathode 1 which is at a voltage Vs and has a distant planar extractor 11. The planar extractor has a positive voltage $+V_1$ with respect to the source 1. The combination of source and extractor now serves as a negative lens. The extracted electrons passing the extractor $\mathbf{1}_1$ thus expand due to the diverging electric field. Again, a virtual crossover is created, which reduces the loss of resolution due to Coulomb interactions to a great extent. Between source 1 and extractor $\mathbf{1}_1$ a space charged region S is present as is shown in FIG. 3A. The presence of this space charge enhances the negative lens effect created by the source-extractor combination.

By tuning $V_1$ it is possible to let the source 1 operate in its space charge limited emission mode. The main advantage of this emission mode is the significant increase of homogeneity of the emission. The increase of the total current can be limited by selecting a source with a confined emission area.

The aperture array 6 has apertures of typically 5-150 μm in diameter with a pitch of about 50-500 μm. The apertures are preferably arranged in a hexagonal pattern. The aperture array 6 splits the incoming parallel beam of electrons 5 in a plurality of electron beamlets, typically in the order of about 5,000-30,000. The size of the apertures is adjusted to compensate non-uniform current density of the illumination. Each aperture has an area inversely proportional to the current density based on the individual beamlets that is transmitted through that same aperture. Consequently the current in each individual beamlet is the same. If the heat load on the aperture plate becomes too large, several aperture arrays are arranged in a serial order with decreasing aperture diameters along the path of the electron beam or plurality of electron beamlets. These aperture arrays have mutually aligned apertures.

Another possible way to split the collimated electron beam 5 into a plurality of electron beamlets is the use of a quadrupole lens array. A possible configuration of such an array is disclosed in U.S. Pat. No. 6,333,508, which document is referenced here as if fully set forth.

Figure 4:
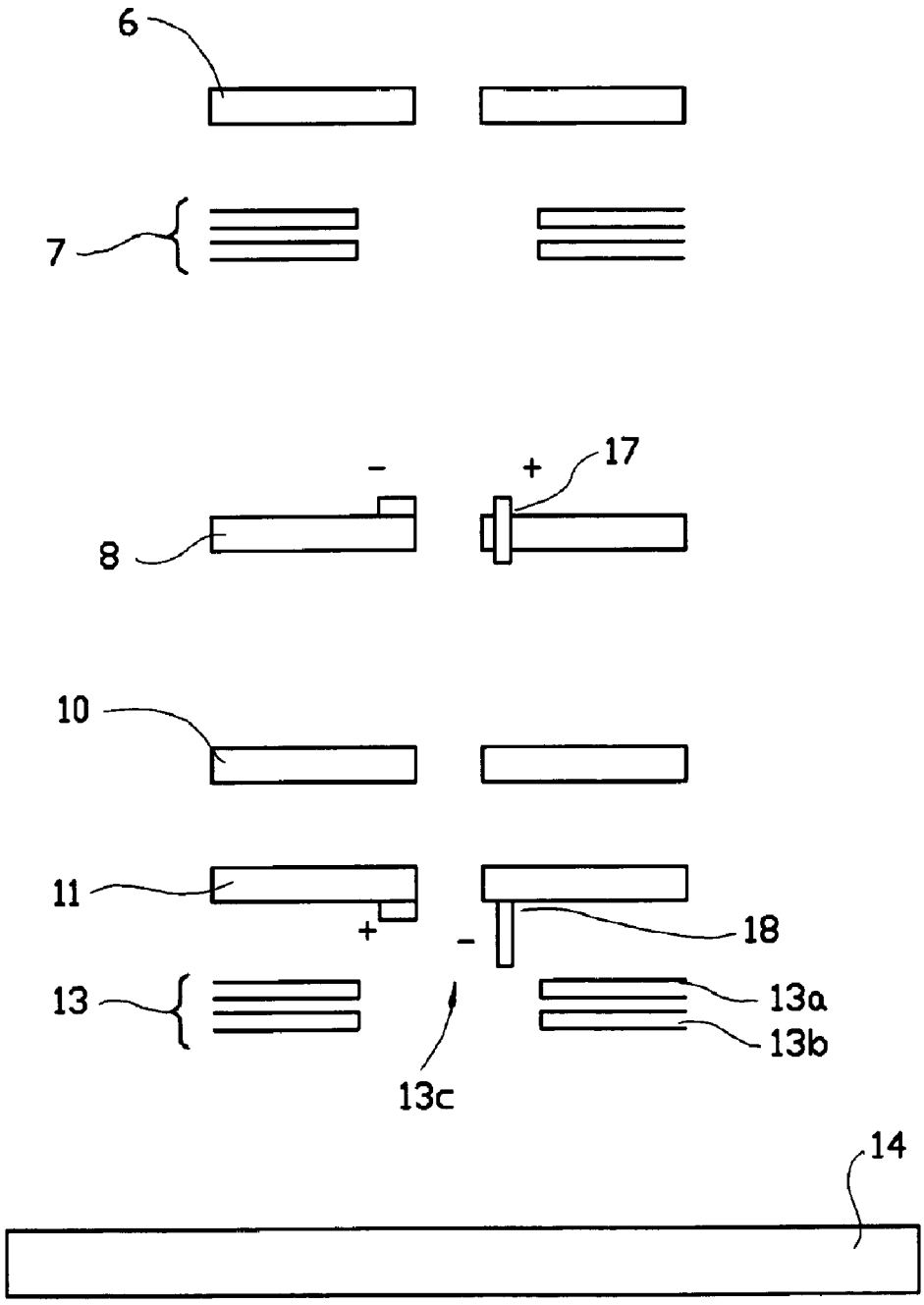
FIG. 4 shows an embodiment of a electron beam exposure apparatus starting from the beamlets.

FIG. 4 shows a detail closer image of the lithography system in one of the embodiments of the present invention starting from the plurality of beamlets. Condensor lens array 7 focuses each beamlet to a diameter of about 0.1-1 μm. It comprises two aligned plates with holes. The thickness of the plates is typically about 10-500 μm, while the holes are typically about 50-200 μm in diameter with a 50-500-μm pitch. Insulators (not shown), which are shielded from the beamlets, support the plates at typical distances of 1-10 millimetres from each other.

The modulation array comprises a beamlet blanker array 8 and a beamlet stop array 10. At the beamlet blanker array 8, the typical beam diameter is about 0.1-5 μm while the typical transversal energy is in the order of a 1-20 meV. Beamlet blanking means 17 are used to switch the electron beamlets on and off. They include blanking electrostatic deflectors, which comprise a number of electrodes. Preferably at least one electrode is grounded. Another electrode is connected to a circuit. Via this circuit control data are sent towards the blanking electrostatic deflectors. In this way, each blanking deflector can be controlled individually. Without the use of the beamlet blanking means 17 the electron beamlet will pass the beamlet stop array 10 through the apertures. When a voltage is applied on a blanking electrostatic deflector electrode in the beamlet blanker array 8, the corresponding electron beamlet will be, deflected and terminate on the beamlet stop array 10.

In an embodiment, the beamlet blanker array 8 is located in the electrostatic focal plane of the electron beamlets. With the blanker array in this position, the system is less sensitive for distortions. In this embodiment, the beamlet stop array is positioned outside a focal plane of the electron beamlets.

The transmitted beamlets now have to be focused on the target exposure surface 14. This is done by a focusing electron optical system 13 comprising at least one array with electrostatic lenses. Each individually transmitted electron beamlet is focused on the target exposure surface by a corresponding electrostatic lens. The lens array comprises two or more plates 13a and 13b, both having a thickness of about 10-500 μm and apertures 13c with a diameter of about 50-250 μm. The distance between two consecutive plates is somewhere between 50-800 μm and may be different from plate to plate. If necessary, the focusing electron optical system may also comprise a lens array of the magnetic type. It is then located between the beamlet stop array 10 and the objective lens array of the electrostatic type 13, to further enhance the focusing properties of the electron optical system.

A major problem in all electron beam lithography systems patterning a wafer or a mask is contamination. It reduces the performance of the lithography system significant due to the interaction between electrons and particles in the resist layer, the resist degrades. In a polymeric resist, molecules are released due to cracking. The released resist particles travel through the vacuum and can be absorbed by any of the structures present in the system.

In order to cope with the contamination problem, in a particular embodiment protective means are located in close proximity of the target exposure surface, i.e. between the target exposure surface and the focusing electron optical system. Said protective means may be a foil or a plate. Both options are provided with apertures with a diameter smaller than 20 μm. The protective means absorb the released resist particles before they can reach any of the sensitive elements in the lithography system. In some cases it is necessary to refresh the protective means after a predetermined period, e.g. after every processed wafer or mask. In the case of a protective plate the whole plate can be replaced. In a particular embodiment, the foil is wound around the coil winders. A small section of the foil is tightened just above the entire target exposure surface 14. Only this section is exposed to the contaminants. After a certain period the protective capacity of the foil rapidly degrades due to the absorbed particles. The exposed foil section then needs to be replaced. To do this the foil is transported from one coil winder to the other coil winder, thus exposing a fresh foil section to the contamination particles.

The entire system that is described above operates at relatively low voltages. In operations in which high-energy electrons are needed, an additional acceleration stage is positioned between the electrostatic lens array of the focusing electron optical system 13 and the protective means. This acceleration stage adds energy to the passing electrons. The beam may be accelerated additional tens of kiloelectronvolts, e.g. 50 keV.

As explained earlier in FIG. 1, the beamlets 12 that have successfully passed the beamlet stop array 10 are directed towards the desired position on the target exposure surface 14 by two means. First of all actuation means move the target exposure surface 14 and the rest of the system in a certain mechanical scan direction relatively to each other. Secondly scan deflection means scan the transmitted beamlets 12 electrostatically in a direction that differs from the mechanical scan direction. The scan deflection means comprise electrostatic scan deflectors 18. In FIGS. 1 and 3 these scan deflectors 18 are located on an additional aperture array 11, and are depicted in FIG. 4.

In one embodiment, the electrostatic scan deflectors 18 are deposited on the target exposure surface side of one of the plates of the objective electrostatic lens array 13, such that the deflection essentially occurs in the front focal plane of the objective lenses. The desired result is that the deflected beamlets impinge perpendicularly on the target surface.

In another embodiment there are two deflector arrays, one deflecting in a first direction and the other deflecting in a second, opposite direction. The combined deflection causes displacement of the beamlets a displacement of the beamlets at the target surface location, without changing the perpendicular axis of a beamlet with respect to the target surface.

In a second embodiment, the electrostatic scan deflectors 18 are located on the protective means.

The electrostatic scan deflectors 18 comprise scan deflection electrodes, which are arranged to deflect an assembly of electron beamlets in the same direction. The scan deflection electrodes may be deposited in the form of strips 19 on a suitable plate 20 at the target exposure surface side as is shown in FIG. 5A. The best yield can be established when the strips 19 are deposited close to the beamlet, thus close to the aperture 21, since this reduces $d_{b\text{-}sd}$. Moreover, it is preferable to position the scan deflection electrodes outside an individual beamlet crossover plane.

Figure 5B:
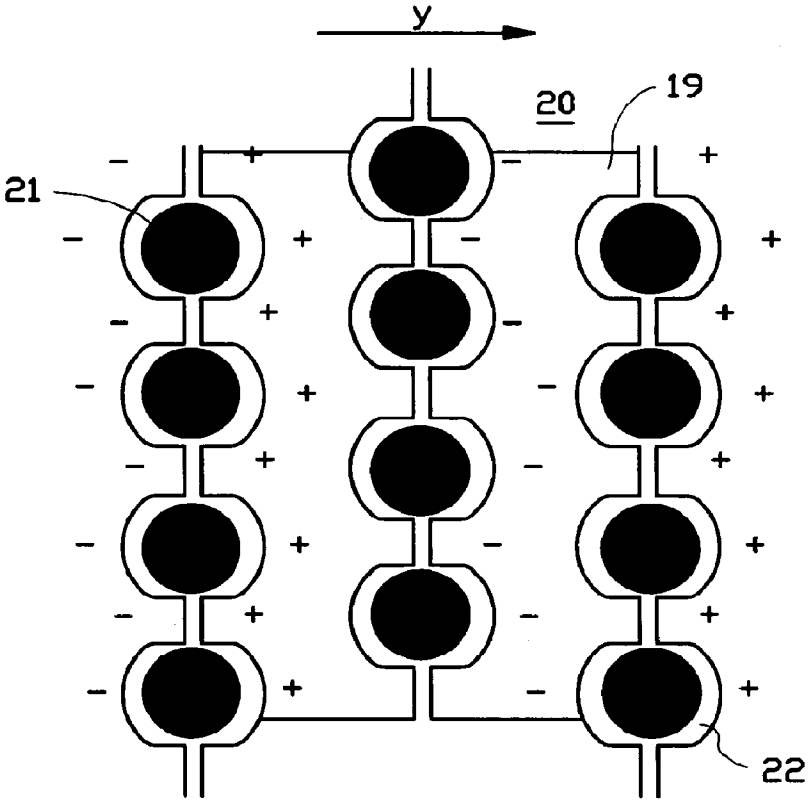
FIG. 5A, 5B show embodiments of scan deflection arrays of the current invention.
Figure 5A:
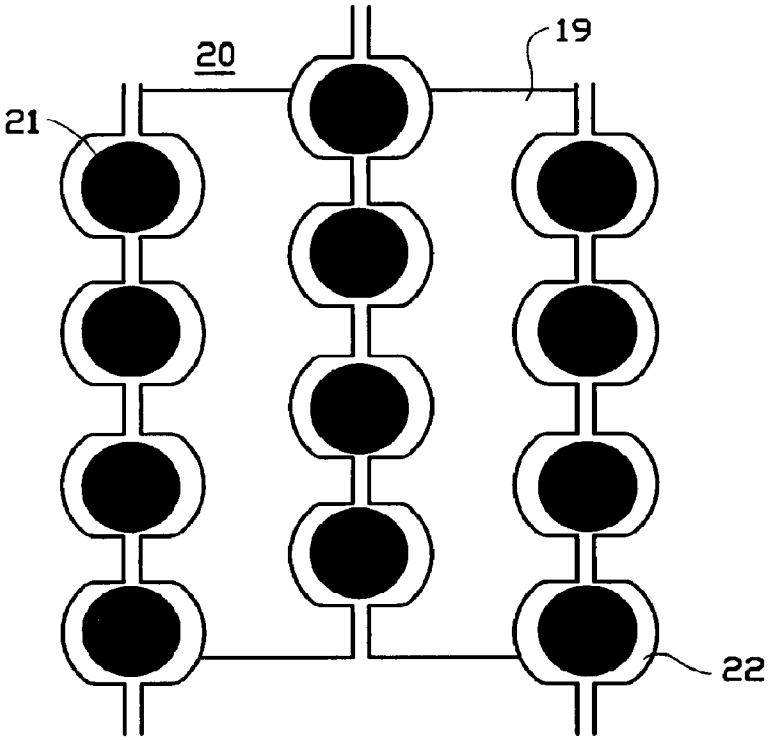

In one embodiment the first assembly is scanned in one direction while the next one is scanned in the opposite direction, by putting alternating voltages on the consecutive strips 19 as is shown in FIG. 5B. The first strip has for instance a positive potential, the second one a negative potential, the next one a positive etc. Say the scan direction is denoted y. One line of transmitted electron beamlets is then scanned in the −y-direction, while at the same time the next line is directed towards +y.

Figures 6A, 6B:
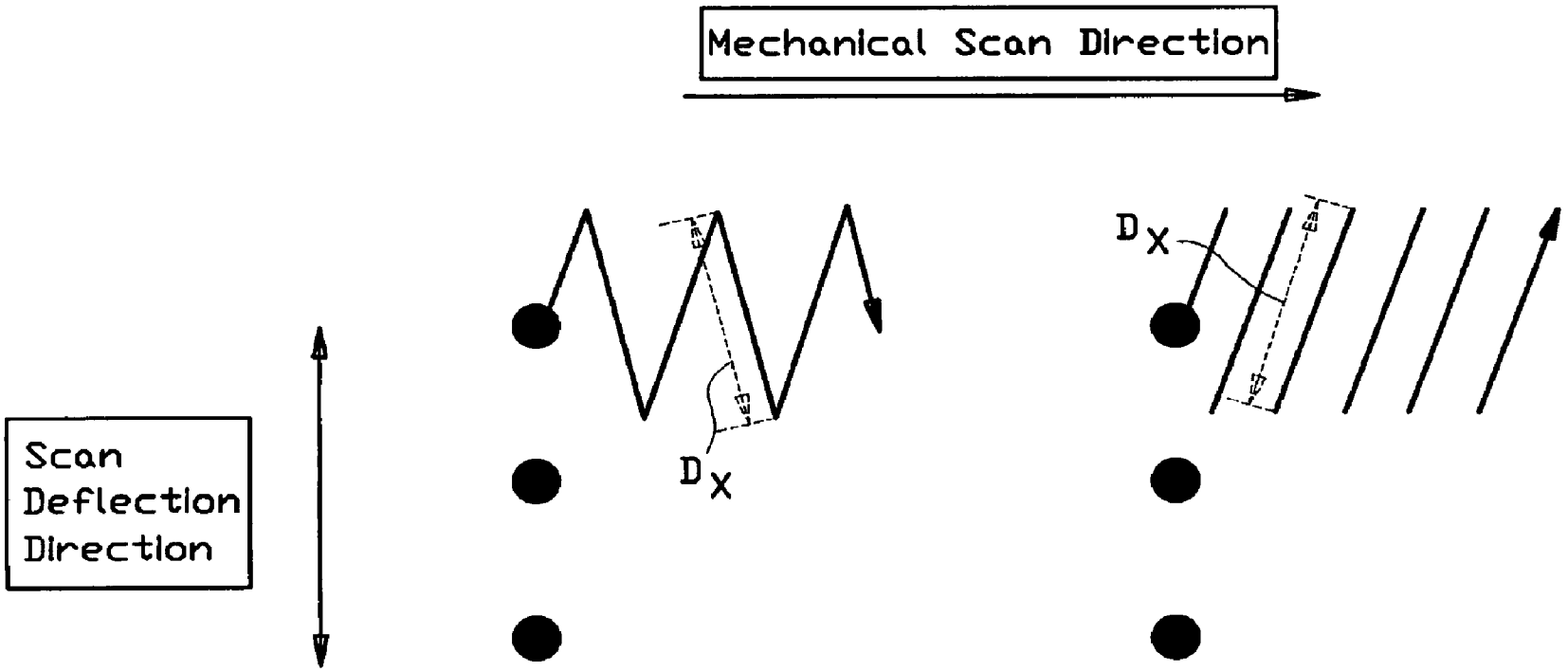
FIG. 6A, 6B show scan trajectories of the present invention.

As already mentioned there are two scan directions, a mechanical scan direction M and a deflection scan direction S, both depicted in FIGS. 6A and 6B. The mechanical scan can be performed in three ways. The target exposure surface moves, the rest of the system moves or they both move in different directions. The deflection scan is performed in a different direction compared to the mechanical scan. It is preferably perpendicular or almost perpendicular to the mechanical scan direction, because the scan deflection length Δx is then larger for the same deflection scan angle $\alpha_{sd}$. There are two preferable scan trajectories, both shown in FIG. 6 for clarity. The first one is a triangular shaped scan trajectory (FIG. 6A), the second one a saw tooth shaped scan trajectory (FIG. 6B).

When the mechanical scan length is a throughput-limiting factor, an assembly of electron beam exposure apparatuses as described above is used to expose the entire wafer at the same time.

It is assumed that an ideal grid exists on the wafer and that the electron beamlets can be positioned exactly on the grid coordinates. Say that a correct pattern is created when the electron beamlet can be positioned within $1/30^{th}$ of the minimum feature size. Then to write one pixel, 30 scan lines and thus 30*30=900 grid points are needed. For the 45 nm-mode the positioning should be controllable within a range of 1.5 nm. The data path should therefore be able to handle an enormous amount of data.

The writing strategy described above is based on the assumption that the beamlet can only be switched on or off. To reduce the amount of data by less grid lines, and thus less grid cells seems a logical approach. However, the dimension control of the desired pattern suffers considerably. An approach to circumvent this problem is to pattern the target exposure surface 14 with discrete dose control. Again the pattern is divided according to a rectangular grid. However, the number of grid lines is much smaller e.g. 2-5 per dimension, which results in a number of grid points of about 4-25. In order to get the same pattern reliability as for the finer grid, the intensity of each grid cell is variable. The intensity is represented by a so-called gray value. In case of a 3 bit gray value representation, the values are 0, 1/7, 2/7, 3/7, 4/7, 5/7, 6/7 and 1 times the maximum dose. The number of data required for the position of the beamlet reduces, although each cell is represented with more information due to the controlled dose variation.

In the present invention gray scale writing can be introduced in several ways. First of all the deflection of the beams may be controlled in such a way that part of the beam passes the beamlet stop array 10, while part of the beam continues traveling towards the target exposure surface 14. In this way for instance 1/3 or 2/3 of the beam can be stopped, resulting in 4 possible doses on the target exposure surface, namely 0, 1/3, 2/3 and 1 times the maximum dose, corresponding to a 2 bit gray value representation.

Another method to create gray levels is to deflect the beamlets in such a way that they do not move with respect to the target surface for a predetermined amount of time T, which amount of time T is longer than a minimum on/off time of the blankers. During time T, the modulator can now deposite 1, 2, 3, etc. shots on one position, thus creating gray levels.

Another method to create these 4 so-called gray values is to change the aperture size in the aperture array 6. If there are for instance three aperture sizes, the original size, a size that permits half the original current to pass and apertures with an area such that only a fourth of the original current passes, the same discrete dose values as mentioned before an be created. By switching the beamlets on and off with the deflection electrodes 17 of the beamlet blanker array 8 the desired dose can be deposited on the target exposure surface 14. A disadvantage of the latter method is the fact that more beamlets are needed to write one pixel. Most, including aforementioned methods for discrete dose control can also be used to create more than 4 gray values, e.g. 8, 16, 32 or 64.

The positions of the beamlets on the target exposure surface most often do not exactly correspond with the desired positions. This is for instance due to misalignment of the different arrays with respect to each other. Additionally, manufacturing errors may also contribute to the offset of the individual beamlets. To transfer the correct pattern from the controller onto the exposure surface of the target, corrections have to be made. To this end, in a particular embodiment, first the position of all beamlets is measured and stored. Each position is then compared to the position the beamlet should have. The difference in position is then integrated in the pattern information that is sent to the modulation means.

Figures 7A, 7B, 7C, 7D:
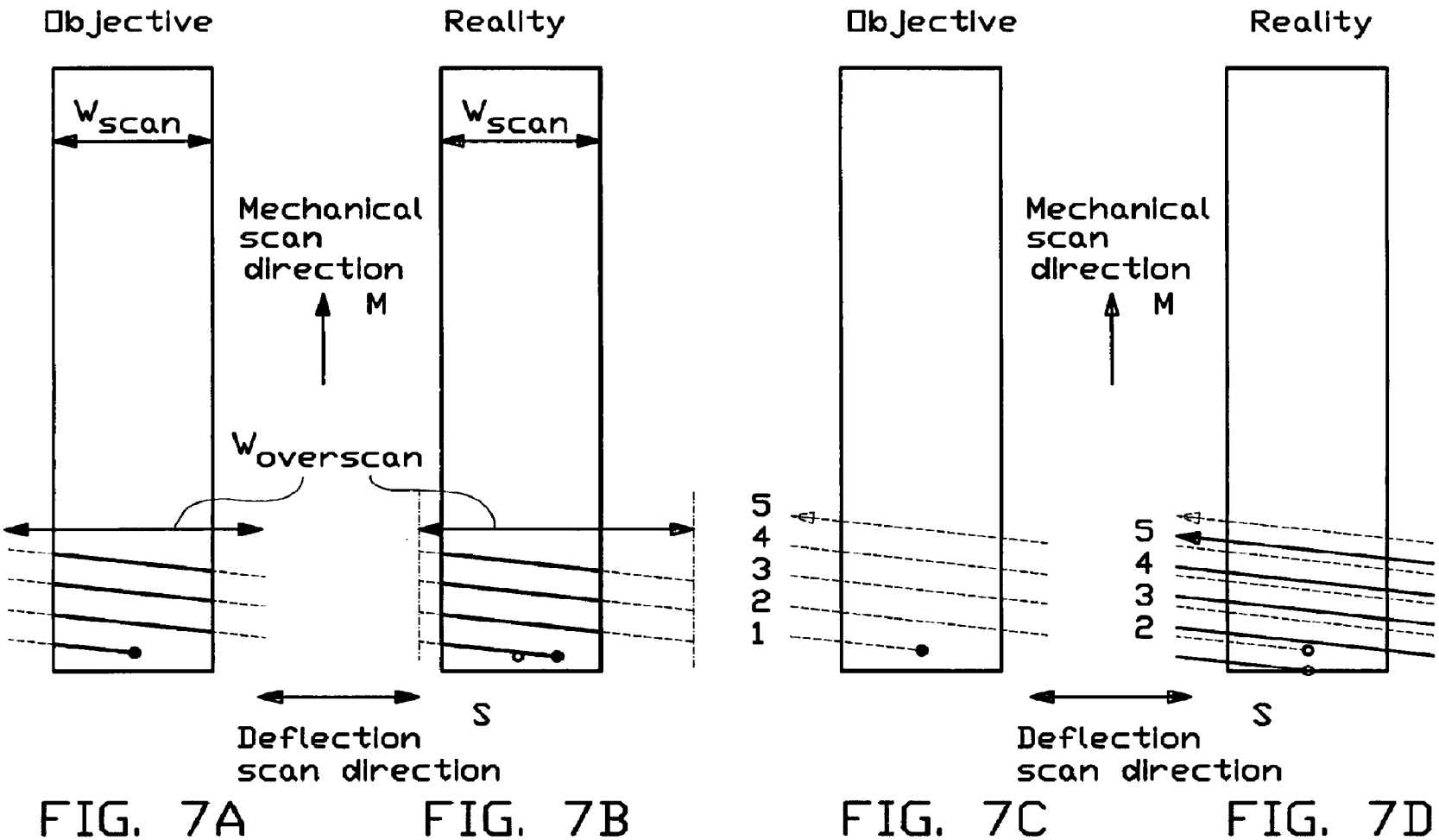
FIG. 7A-7D show adjustment of modulation timing.

Since changing the signal sequence that is sent towards the modulation means takes a lot of time, the measured difference in position is integrated in the pattern information by transforming it into a corresponding difference in timing in the beamlet modulation control. FIGS. 7A-7D and 8A-8B explain how the adjustments are implemented. As already mentioned the beamlet scan is performed by combining two scan mechanisms: a mechanical scan and a deflection scan. All pattern data, which is sent to each beamlet, is supplied per deflection scan line. The desired deflection scan width on the exposure surface of the target that is patterned, $W_{scan}$, is smaller than the deflection scan width the apparatus can handle, $W_{overscan}$, as is shown in FIGS. 7A AND 7B. The overscan ability enables a correction in the deflection scan direction. In FIG. 7A the beamlet is positioned correctly. In FIG. 7B, however, the beamlet has shifted to the right. By adjusting the timing in such a way that the pattern data is applied when the beamlet enters the desired area, the offset can be compensated for. The adjustment in the mechanical scan direction is less precise than depicted in FIG. 7B. Since the pattern data is written per scan line, only a discrete time delay is possible, i.e. pattern generation can be postponed or accelerated per scan line. A random time delay would result in a completely new control data sequence. A calculation of such a new sequence takes a lot of time and is therefore not desirable. In FIGS. 7C AND 7D is depicted what the consequence is. In FIG. 7C again the desired location of the beamlet is shown together with its first five corresponding scan lines. In FIG. 7D the real position of the beamlet and its trajectories is shown. For clarity the desired beamlet and scan lines are also depicted with an empty circle and dashed lines, respectively. It can be seen that the first scan line in the desired situation does not cover the area that needs to be patterned by the beamlet. So the beamlet start patterning halfway the second scan line. Effectively the delay of information has taken a time period that is necessary to scan one deflection scan line.

Figure 8B:
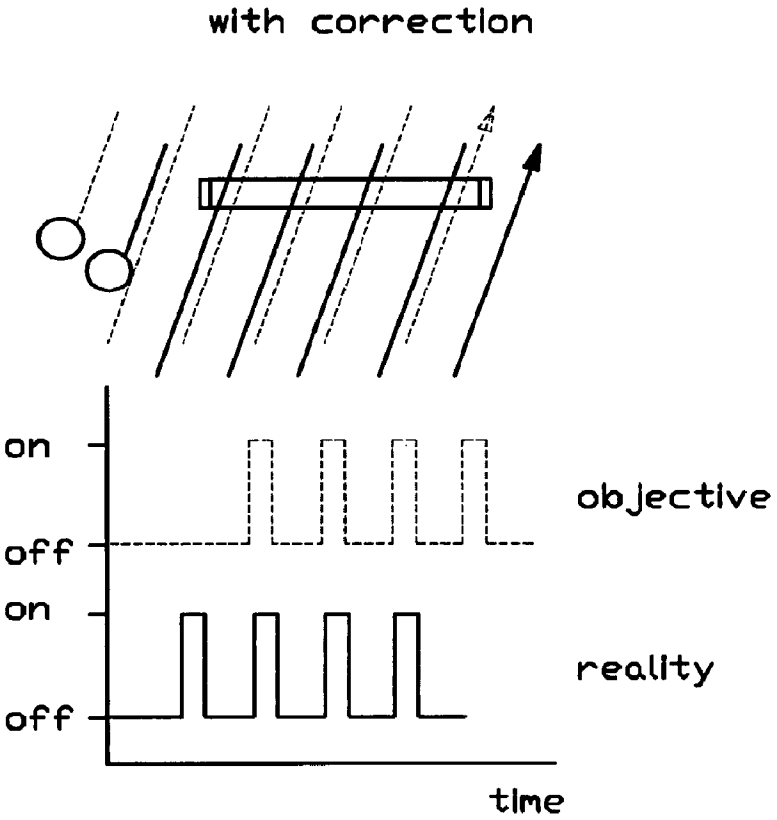
FIG. 8A, 8B show effects of adjustment of modulation timing.
Figure 8A:
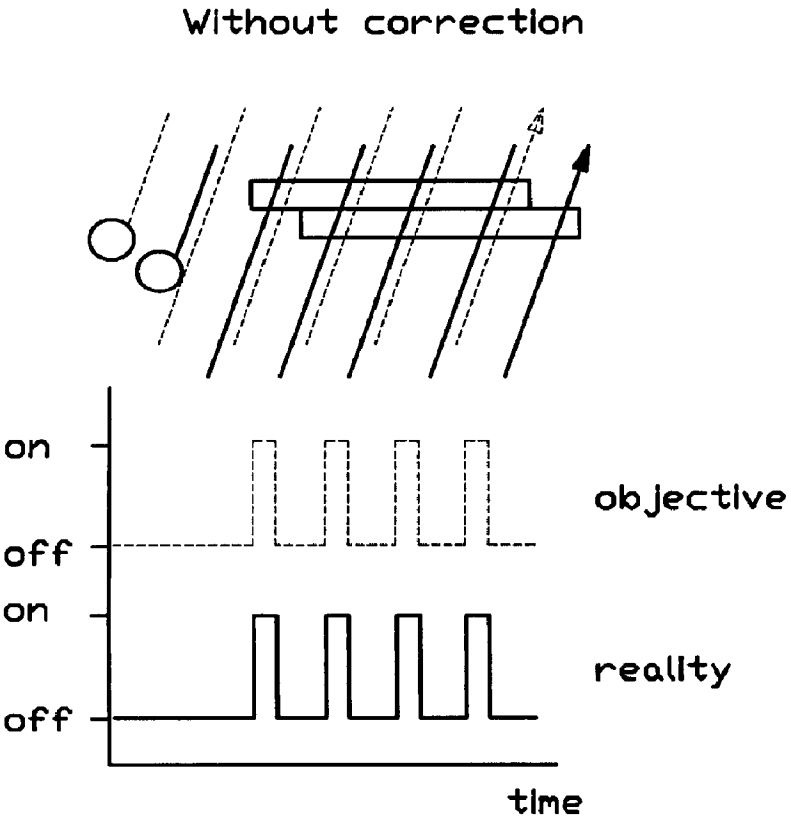

FIGS. 8A and 8B show an example of how a change in the timing corrects for the initial incorrect position of a structure written by a not ideally positioned beamlet. FIG. 8A depicts the situation without any timing correction. The empty dot represents the beamlet at the correct position, while the filled one represents the real location of the beamlet. The beamlet is scanned along the drawn line to write a pattern. The line is dashed in the ideal case and solid in the real case. In this example the written structure is a single line. Consider a black and write writing strategy, i.e. the beamlet is "on" or "off". The pattern is written when the "on" signal is sent towards the modulation means. In order to write the single line a certain signal sequence like the one shown in the upper curve is sent towards the modulation means. When the same signal sequence is sent in reality, the line is written at a different position than desired. The offset of the beamlet leads to an offset of the written structure.

FIG. 8B shows the situation wherein timing correction is applied. Again the theoretical and actual spots and trajectories are depicted with dashed and solid lines and dots respectively. The signal sequence in the real situation is different than the theoretical pattern information, in the fact that the signal sequence in the real situation (lower curve) is sent at a different time than the same sequence is sent in the idea configuration (upper curve). As a result the single line is now written at the correct location in the deflection scan direction. Moreover the pattern processing started one scan line earlier resulting in a better positioning of the single line in the mechanical scan direction as well. Note that the single line is not precisely positioned at the correct location. This is due to the slight offset between the scan lines in the ideal and the real situation.

The current electron beam exposure system is thus capable of dynamically adjusting the position of a scanned line using timing corrections. This allows for critical components in a pattern to be written in one scan line instead of using two halves of two scan lines, which would spread the critical component over two scan lines. This correction can also be done locally, i.e. the timing can be corrected over a small time window. The controller should thus identify critical components, which would normally be spread over two scan lines. Subsequently, the controller should calculated a corrected timing window, and apply the corrected timing window to the timing base used for scanning an electron beamlet. FIG. 7D shows the adjustment principle, which could be used for this.

All lens plates, aperture plates and blanker plates can be connected to a power supply, which, when gas is admitted into the system, creates a plasma. The plasma cleans the plates and removes all contamination. If one plasma does not clean thorough enough, two gases may be admitted into the system in series. For instance oxygen may be admitted first to remove all hydrocarbons residing in the system. After the removal of the oxygen plasma, a second plasma, for instance comprising HF, is created to remove all present oxides.

Another possibility to reduce the contamination is to perform all operations at elevated temperatures, i.e. 150-400° C. A pretreatment at 1000-1500° C. may be necessary. At these temperatures hydrocarbons get no chance to condense on any of the elements in the system. Allowing a fraction of oxygen into the system can further enhance the cleaning process.

It is to be understood that the above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the present invention.

The invention claimed is:

[1. A method for transferring a pattern onto a target exposure surface with a multi-beam lithography system, comprising the steps of:

generating a plurality of beamlets;

individually modulating the intensity of each beamlet of said plurality of beamlets by means of a modulator device;

controlling said modulator device, using control signals, by means of a controller operationally coupled to said modulator;

individually adjusting said control signals.]

[2. The method according to claim 1 in which timing of said control signals is adjusted.]

[3. The method of claim 1, in which timing of said control signals is individually adjusted.]

[4. The method according to claim 1 in which modulation is performed as an "off" or "on" condition of a beamlet, by either deflecting said beamlet within the system, or by allowing free passage of said beamlet at said modulator, the condition thereby being controlled on the basis of available electronic pattern data, in which timing is adjusted by correcting an instance of deflection or passage of said beamlet, said correction being calculated by the controller.]

[5. The method of claim 1, said control signals having a timing base, and timing of the control signal of at least one beamlet is adjusted.]

[6. The method of claim 1, further comprising the step of determining a position of a beamlet, storing said position in a memory and comparing said position with a desired position.]

[7. The method of claim 6, wherein said position of a beamlet is the actual position of a beamlet on said exposure surface.]

[8. The method of claim 6, wherein said adjustment of said timing is based on the result of said comparing.]

[9. The method of claim 1, wherein said timing is adjusted locally.]

[10. The method of claim 1, wherein adjusting timing comprises correcting a timing window.]

[11. The method of claim 1, wherein said control signals have a timing base.]

[12. The method of claim 11, wherein said controller calculates a corrected timing window, and applies said corrected timing window to said timing base.]

[13. The method of claim 11, wherein said controller calculates a corrected timing window, and applies said corrected timing window to said timing base of an individual beamlet.]

[14. An electron beam exposure apparatus for transferring a pattern onto the surface of a target using a plurality of electron beamlets, comprising:

a modulator array for receiving said plurality of electron beamlets, comprising a plurality of modulators for modulating the intensity of a beamlet of said plurality of beamlets;

a controller, operationally coupled to said modulator array, for controlling each modulator of said plurality modulators, said controller producing a plurality of control signals with at least one control signal for each modulator, and an adjustor for allowing individual adjustment of a control signal.]

[15. The electron beam exposure apparatus according to claim 14, wherein said plurality of control signals having a timing base.]

[16. The electron beam exposure apparatus according to claim 14, wherein said adjustor is adapted for allowing individual adjustment of timing of a control signal.]

[17. The electron beam exposure apparatus according to claim 14, furthermore provided with a measuring device for measuring the actual position of at least one of said beamlets, and wherein the controller is provided with a memory for storing said actual position and a desired position, a comparator for comparing the desired position and the actual position of said at least one of said beamlets, and wherein the adjustor is operationally coupled to the controller for receiving instructions for adjusting a control signal issued to a modulator to compensate for the difference between said desired position and said actual position of said at least one of said electron beamlets.]

[18. The electron beam exposure apparatus according to claim 14, wherein the adjustor is operationally coupled to the controller for receiving instructions indicating the amount of the adjustments.]

[19. The electron beam exposure apparatus of claim 14, wherein the adjustor is adapted for adjusting timing of each control signal.]

[20. The electron beam exposure apparatus of claim 14, further comprising a beamlet generator, said beamlet generator comprising:

a source for emitting at least one electron beam, at least one beamsplitter for splitting said at least one emitted electron beam into said plurality of electron beamlets.]

[21. The electron beam exposure apparatus according to claim 20, further comprising a modulation array, comprising a beamlet blanker array comprising a plurality of beamlet blankers for the deflection of a passing electron beamlet and a beamlet stop array, having a plurality of apertures aligned with said beamlet blankers of said beamlet blanker array.]

[22. The electron beam exposure apparatus according to claim 20, further comprising a second electrostatic lens array located between said beamsplitter and said beamlet blanker array to focus said plurality of electron beamlets.]

[23. The electron beam exposure apparatus according to claim 22, wherein said beamlet blanker array is located in the focal plane of said second electrostatic lens array.]

[24. An electron beam exposure apparatus for transferring a pattern onto the surface of a target using a plurality of electron beamlets, comprising:

a modulator array for receiving said plurality of electron beamlets, comprising a plurality of modulators for modulating the intensity of a beamlet of said plurality of beamlets;

a controller, operationally coupled to said modulator array, for controlling each modulator of said plurality modulators, said controller producing a plurality of control signals with at least one control signal for each modulator, said controller comprising an adjustor allowing individual adjustment of at least one control signal.]

[25. The electron beam exposure apparatus of claim 24, wherein said plurality of control signals having a timing base.]

[26. The electron beam exposure apparatus of claim 24, said adjustor allowing individual adjustment of timing of at least one control signal.]

[27. An electron beam exposure apparatus for transferring a pattern onto the surface of a target using a plurality of electron beamlets, comprising:

a scanning deflector for scanning said plurality of electron beamlets over said surface of said target, comprising at least one array of electrostatic deflectors having at least one electrostatic deflector for each beamlet;

a controller, operationally coupled to said scanning deflector, for controlling each electrostatic deflector using a control signal;

an adjustor for adusting said control signal.]

[28. The electron electron beam exposure apparatus of claim 27, wherein said control signal has a timing base, and said adjustor being adapted for adjusting timing of said control signal.]

[29. An electron beam exposure apparatus for transferring a pattern onto the surface of a target using a plurality of electron beamlets, comprising:

a scanning deflector for scanning said plurality of electron beamlets over said surface of said target, comprising at least one array of electrostatic deflectors having at least one electrostatic deflector for each beamlet;

a controller, operationally coupled to said scanning deflector, for controlling each electrostatic deflector using a control signal, said controller being adapted for adjusting at least one control signal.]

[30. The electron beam exposure apparatus of claim 29, wherein said controller is operationally coupled to said scanning deflector for controlling each electrostatic deflector using a control signal having a timing base.]

[31. The electron beam exposure apparatus of claim 29, wherein said controller being adapted for adjusting timing of at least one control signal.]

[32. The electron beam exposure apparatus of claim 29, wherein said controller generates a plurality of control signals, at least one control signal for each electrostatic deflector.]

[33. The electron beam exposure apparatus of claim 32, wherein said controller is adapted for adjusting timing of each control signal.]

[34. The electron beam exposure apparatus of claim 32, wherein said controller is adapted for adjusting timing of each control signal individually.]

[35. An electron beam exposure apparatus for transferring a pattern onto the surface of a target using a plurality of electron beamlets, comprising:

a blanking deflection means for effectively realising an off/on condition for individual beamlets at said target surface, by deflecting such individual beamlets within the system;

a controller, operationally coupled to said blanking deflection means, for individually controlling electrostatic deflectors of said blanking deflection means, said controller using an individual control signal for each deflector of said deflection means, thereby determining said on and off condition for individual beamlets;

correction means, part of, or operationally associated with said controller for individually correcting a timing window of a beamlet adjusting the control signal of the blanking deflector for said beamlet.]

[36. An electron beam exposure apparatus for transferring a pattern onto the surface of a target using a plurality of electron beamlets, comprising:

a blanking deflection device for effectively realising an off/on condition for individual beamlets at said target surface, comprising a plurality of deflectors for deflecting such individual beamlets within the system for realising said off/on condition;

a controller, operationally coupled to said blanking deflection device, for individually controlling electrostatic deflectors of said blanking deflection device, said controller using an individual control signal for each deflector of said deflection device, thereby determining said on and off condition for individual beamlets;

a correction device, part of, or operationally associated with said controller for individually correcting a timing window of a beamlet adjusting the control signal of the blanking deflector for said beamlet.]

*37. An electron beam generator for generating an electron beam, comprising:*

*an electron source; and*

*an extractor for extracting electrons from the electron source, the extractor comprising an electrode located after a space charge region of the source;*

*wherein the electron source and extractor are included so as to jointly operate, in use, as a single unit to form a negative lens.*

*38. The electron beam generator according to claim 37, wherein the extractor is a planar extractor.*

*39. The electron beam generator according to claim 37, wherein the extractor and the electron source are positioned with respect to each other such that, in use, a space charge limited region is present between them.*

*40. The electron beam generator according to claim 37, wherein the electron source has a confined emission area.*

*41. The electron beam generator according to claim 37, further comprising an illumination system for collimating the electron beam.*

*42. The electron beam generator according to claim 41, wherein the illumination system comprises two lenses.*

*43. A maskless lithography system for transferring a pattern onto the surface of a target, comprising:*

*an electron beam generator according to claim 37;*

*a beam splitter for splitting an electron beam generated by the electron beam generator into a plurality of beamlets;*

*a modulation array for modulating the plurality of beamlets in accordance with a pattern to be transferred;*

*an optical system for focusing the plurality of beamlets; and*

*a target holder for holding a target with its surface onto which the pattern is to be transferred in a focal plane of the optical system.*

*44. The maskless lithography system of claim 43, wherein the electron beam generator further comprises an illumination system for collimating the electron beam to create a parallel beam of electrons at the beam splitter.*

*45. A method of generating an electron beam, the method comprising:*

*providing an electron source;*

*providing an extractor for extracting electrons from the electron source, the extractor comprising an electrode located after a space charge region of the source;*

*providing a voltage to said electrode, said voltage being positive with respect to the electron source, and*

*tuning the positive voltage so that the source operates in its space charge limited region and so that the electron source and extractor jointly operate to form a negative lens.*

*46. A maskless system for exposing a surface of a moveable target, comprising:*

*an electron beam generator including an extractor electrode for generating a diverging beam;*

*a first optical system for generating a collimated beam from the diverging beam;*

*a beam splitter for generating a plurality of beamlets from the collimated beam;*

*a second optical system for reducing a cross section of the beamlets;*

*the electron beam generator further including an electron source, wherein the extractor electrode is located after a space charge region of the source, and wherein the electron source and extractor are included so as to jointly operate, in use, to form a negative lens.*

*47. The system according to claim 46, further comprising a modulation array for modulating intensity of the beamlets, said modulation array comprising a beamlet blanker array and a beamlet stop array.*

*48. The system according to claim 47, wherein the beamlet blanker array comprises an array of electrostatic deflectors, each electrostatic deflector comprising a first electrode connected to ground and a second electrode connected to a circuit receiving control data.*

*49. The system according to claim 48, wherein the beamlet blanker array is located between the first optical system and the second optical system.*

*50. The system according to claim 48, wherein each electrostatic deflector is controlled individually.*

*51. The system according to claim 48, wherein the second optical system comprises an array of electrostatic lenses for focusing the beamlets.*

*52. The system according to claim 46, wherein the extractor is a planar extractor.*

*53. The system according to claim 46, wherein the extractor and the electron source are positioned with respect to each other such that, in use, a space charge limited region is present between them.*

*54. The system according to claim 46, wherein the electron source has a confined emission area.*

*55. The system according to claim 46, wherein the beamlets are accelerated in a vacuum.*

*56. The system according to claim 46, further comprising an acceleration stage for accelerating the beamlets towards the target.*

* * * * *